(12) United States Patent
Sasaki

(10) Patent No.: US 7,135,376 B2
(45) Date of Patent: Nov. 14, 2006

(54) RESISTANCE DIVIDING CIRCUIT AND MANUFACTURING METHOD THEREOF

(75) Inventor: Seiichiro Sasaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/016,323

(22) Filed: Dec. 20, 2004

(65) Prior Publication Data
US 2005/0170644 A1  Aug. 4, 2005

(30) Foreign Application Priority Data
Dec. 24, 2003  (JP) .............................. 2003-426996

(51) Int. Cl.
- H01L 21/00  (2006.01)
- H01L 29/00  (2006.01)
- H01C 1/14  (2006.01)
- H03F 1/00  (2006.01)

(52) U.S. Cl. ...................... 438/382; 257/537; 338/323; 330/86

(58) Field of Classification Search ........ 257/536–538; 438/382; 338/295, 325, 323; 330/86
See application file for complete search history.

(56) References Cited

U.S. PATENT DOCUMENTS

| | | | | |
|---|---|---|---|---|
| 5,285,169 A | * | 2/1994 | Theus .................... 330/254 |
| 5,339,067 A | * | 8/1994 | Harris et al. ............. 338/323 |
| 5,523,721 A | * | 6/1996 | Segawa et al. ............ 330/86 |
| 5,963,784 A | * | 10/1999 | Bothra et al. ............. 438/18 |
| 6,013,940 A | * | 1/2000 | Harada et al. ............ 257/538 |
| 6,403,943 B1 | * | 6/2002 | Wada et al. ............ 250/214 A |
| 6,667,537 B1 | * | 12/2003 | Koike et al. ............. 257/536 |
| 6,700,474 B1 | * | 3/2004 | Leibiger .................. 338/309 |
| 2002/0123202 A1 | * | 9/2002 | Amishiro et al. ........ 438/382 |
| 2003/0178697 A1 | * | 9/2003 | Lee et al. ............... 257/536 |
| 2004/0196063 A1 | * | 10/2004 | Wong et al. .............. 326/30 |
| 2004/0235258 A1 | * | 11/2004 | Wu et al. ................ 438/384 |

FOREIGN PATENT DOCUMENTS

JP        5-30072 B2     5/1993

\* cited by examiner

*Primary Examiner*—Evan Pert
(74) *Attorney, Agent, or Firm*—VolentineFrancos& Whitt,PLLC

(57) ABSTRACT

A resistance dividing circuit including silicide layers respectively formed only on branch portions of a linear polysilicon resistance wiring having the branch portions. Contact plugs are connected to the resistance wiring via the silicide layers, and fetching electrodes are respectively connected to the contact plugs.

14 Claims, 5 Drawing Sheets

RESISTANCE DIVIDING CIRCUIT AND MANUFACTURING METHOD THEREOF

BACKGROUND OF THE INVENTION

The present invention relates to a resistance dividing circuit employed in a semiconductor integrated circuit and a method for manufacturing the resistance dividing circuit, using a salicide process.

A resistance dividing circuit has such a shape as shown in FIG. 6 by way of example, illustrated in plan view. The resistance dividing circuit shown in FIG. 6 has a configuration wherein contact plugs are respectively connected to plural points of a resistance wiring composed of polysilicon, and metal wirings are respectively connected to the contact plugs. The metal wirings serve as connecting terminals of the resistance dividing circuit. Arbitrary resistances can be obtained by selecting the connecting terminals. The resistance dividing circuit having such a configuration has been described in a patent document 1 (see Japanese Patent Publication No. Hei 5(1993)-30072).

In the resistance dividing circuit disclosed in FIG. 6, however, the contact plugs are directly connected to their corresponding polysilicon layer. Such a resistance dividing circuit as disclosed in FIG. 6 is normally configured such that its upper side is covered with an insulating layer. Thus, in order to form the contact plugs, there is a need to form contact holes in the insulating layer lying on the polysilicon layer. Upon opening the contact holes, it is hard to provide a suitable etching selection ratio between the insulating layer and the polysilicon layer because the insulating layer is normally $SiO_2$. Therefore, there is a high fear that etching will extend to the polysilicon layer upon opening of the contact holes. In doing so, the resistance of a portion where each of the contact plugs and the polysilicon layer contact varies.

In order to solve such a problem, the polysilicon layer and each contact plug may be connected with a silicide layer interposed therebetween. Since, however, the silicide layer is a material low in resistivity, the values of resistances of portions where the silicide layers are formed, decrease when the silicide layers are formed on the polysilicon layer corresponding to the resistance wiring. Even if the decreases in resistance value are slight, they are piled or built up since the contact plugs are arranged in series on the resistance wiring. Thus, the decreases in resistance value of the circuit as a whole cannot be ignored.

SUMMARY OF THE INVENTION

The present invention has been made in view of the foregoing problems. It is an object of the present invention to provide a resistance dividing circuit using polysilicon as a resistance wiring, which reduces variations in resistance value due to contact plugs connected to the resistance wiring, and a manufacturing method thereof.

In order to attain the above object, there is provided a resistance dividing circuit according to a first embodiment of the present invention, having a linear resistance wiring which extends onto a semiconductor substrate and which has a plurality of branch portions and is made up of polysilicon. The branch portions are formed on the semiconductor substrate. Further, the resistance dividing circuit is provided with silicide layers formed on the branch portions and has an insulating layer formed so as to cover the semiconductor substrate, the resistance wiring and the silicide layers, contact plugs extending through the insulating layer and having lower ends connected to the silicide layers, and fetching terminals connected to upper ends of the contact plugs.

There is also provided a method for manufacturing a resistance dividing circuit, according to a second embodiment of the present invention, comprising forming a linear resistance wiring having a plurality of branch portions and made up of polysilicon on a semiconductor substrate, forming silicide layers on the branch portions, and forming an insulating layer over the semiconductor substrate containing the resistance wiring and the silicide layers. Further, the method includes forming contact plugs extending through the insulating layer and having lower surfaces connected to the silicide layers, and forming fetching terminals respectively connected to upper surfaces of the contact plugs.

Since the silicide layers are provided on the polysilicon layer corresponding to the resistance wiring in the resistance dividing circuit according to the first embodiment of the present invention, the silicide layers serve as etching stoppers when the insulating layer is etched. Therefore, etching does not extend to the polysilicon layer upon opening of the contact holes. Thus, the resistance of a portion where each contact plug and the polysilicon layer are connected, can be held constant. Since the silicide layers are provided on the branch portions of the resistance wiring, decreases in resistance value of the resistance wiring due to the formation of the silicide layers are not built or piled up. Accordingly, the decreases in resistance value do not lead to a large decrease when considering the circuit as a whole.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

First Preferred Embodiment

Figure 1A:
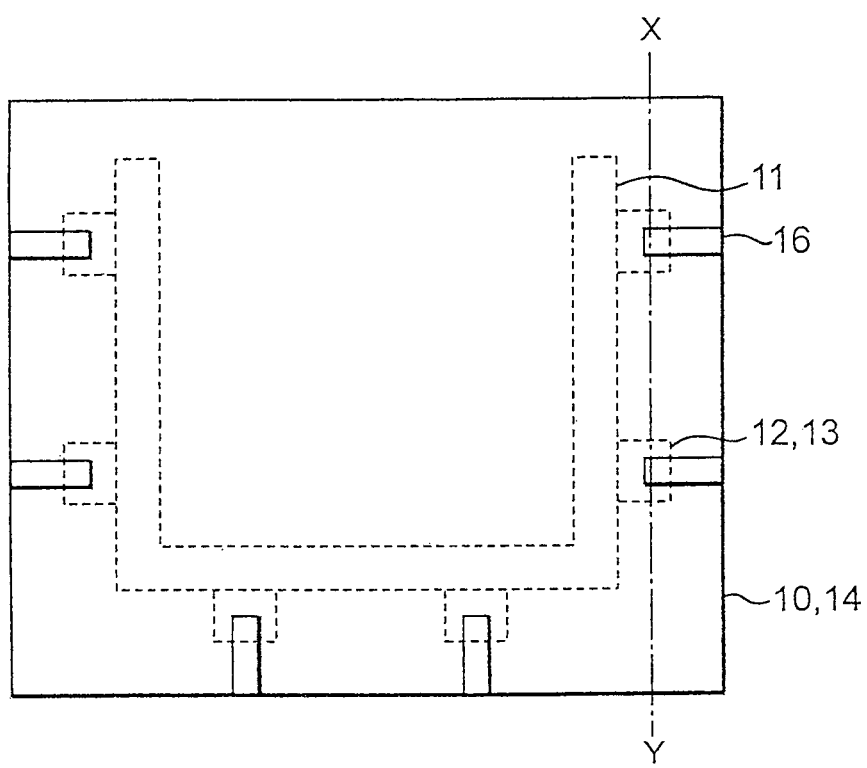
FIGS. 1A and 1B are respectively a plan view and a cross-sectional view showing a resistance dividing circuit of the present invention.
Figure 1B:
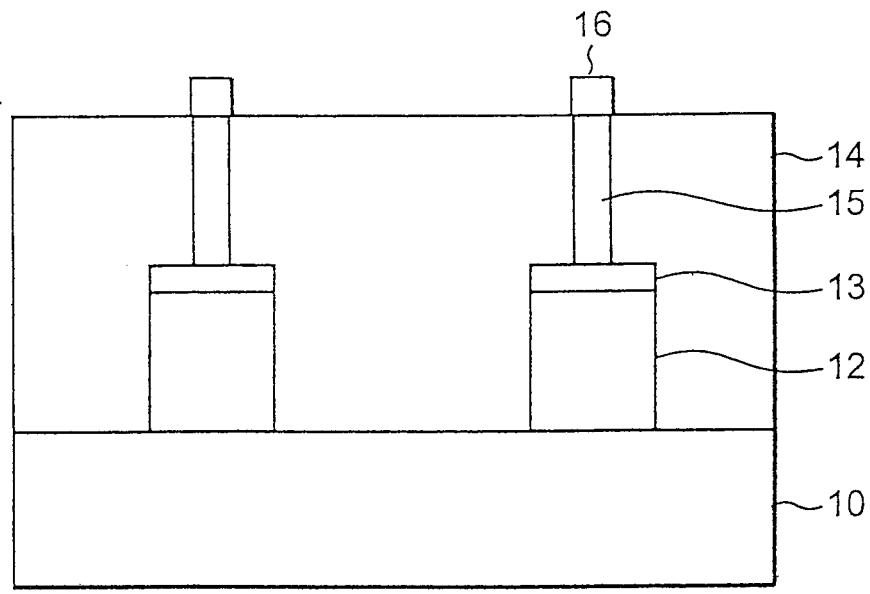

FIG. 1A is a plan view showing a resistance dividing circuit of the present invention. FIG. 1B is a cross-sectional view showing a cut section taken along line X-Y of FIG. 1A.

The resistance dividing circuit of the present invention will be described using FIGS. 1A and 1B.

The resistance dividing circuit 20 of the present invention has a linear polysilicon layer 11 corresponding to a resistance wiring, which is provided on a semiconductor substrate 10. The polysilicon layer 11 has branch portions 12 provided at respective points thereof. Silicide layers 13 are respectively formed on the branch portions 12.

Further, the resistance dividing circuit 20 has an insulating layer 14 formed so as to cover the semiconductor substrate 10 containing the polysilicon layer 11 and the silicide layers 13. Furthermore, contact plugs 15 are formed so as to extend through the insulating layer 14 in the vertical direction. A portion below each contact plug 15 is connected to its corresponding silicide layer 13.

Then, metal wirings 16 used as taking-out or fetching terminals connected to the contact plugs 15 at their upper portions are formed on the insulating layer 14.

The resistance dividing circuit according to the first embodiment of the present invention is provided with the silicide layers 13 provided on the polysilicon layer 11 which serves as the resistance wiring. Therefore, the silicide layers 13 serve as etching stoppers used when the insulating layer 14 is etched to define or open contact holes. Therefore, this etching is effected on the insulating layer 14, but not on the polysilicon layer 11 when the contact holes are opened. Thus, connected portions of the contact plugs 15 and the polysilicon layer can be made identical in shape to the contact plugs 15 respectively. Consequently, the respective contact plugs 15 can be made constant in resistance value.

The silicide layers 13 are provided on their corresponding branch portions 12 of the polysilicon layer 11 and exist only in portions for connecting the fetching terminals and the main body of the resistance wiring. Accordingly, the resistance of the main body of the resistance wiring is not reduced. In other words, any paths each extending from one fetching terminal to another fetching terminal are not via more than two of the silicide layers 13. Thus, decreases in the resistance value of the resistance wiring due to the formation of the silicide layers 13 are not built up. Therefore, the decreases in resistance value do not lead to a large decrease in the circuit as a whole.

Figure 3:
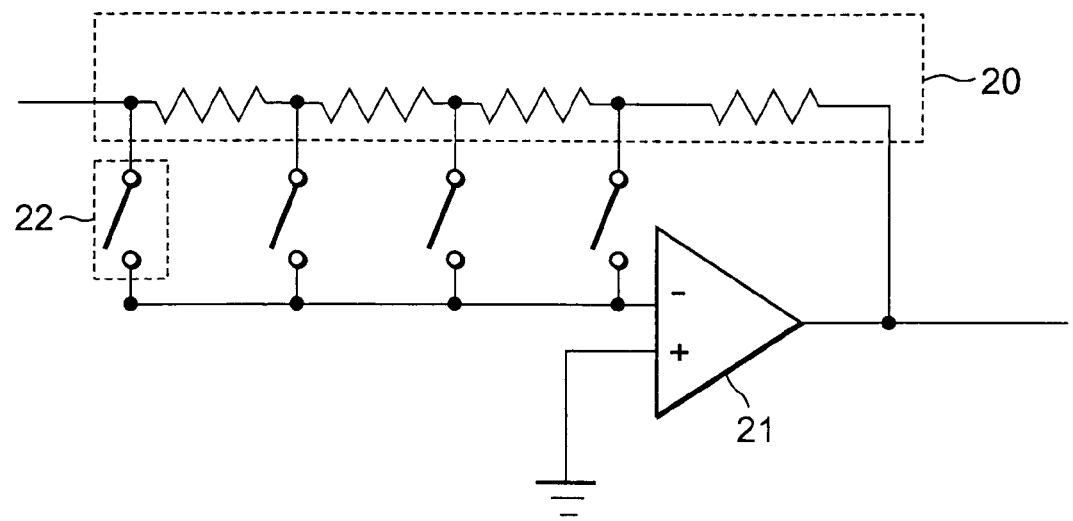
FIG. 3 is a view depicting a circuit to which the resistance dividing circuit of the present invention is applied.

The resistance dividing circuit 20 of the present invention can be applied to, for example, such a circuit as shown in FIG. 3, i.e., a programmable gain amplifier (PGA). The PGA is a circuit which outputs a signal antiphase to an input signal. The PGA is directed to one capable of controlling the gain (amplification factor) of the outputted signal.

Figure 4:
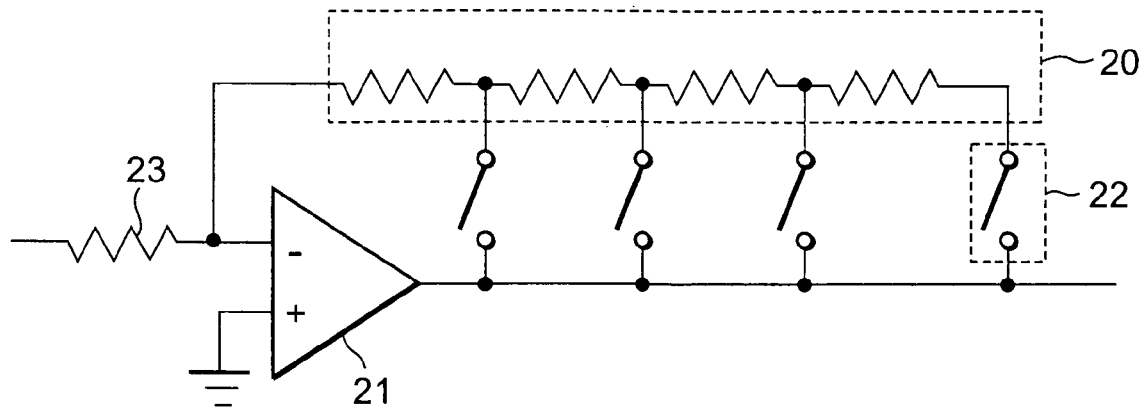
FIG. 4 is a view showing a circuit to which the resistance dividing circuit of the present invention is applied.

The PGA has such a circuit configuration as shown in FIG. 3 or 4, for example. In the circuit shown in FIG. 3, one end of the resistance dividing circuit 20 is connected to an output terminal of an operational (hereinafter abbreviated as "OP") amplifier 21. A plurality of taking-out or fetching electrodes of the resistance dividing circuit 20 are respectively parallel-connected to a low-voltage input terminal of the OP amplifier 21 via discrete switches 22. A high-voltage input terminal of the OP amplifier 21 is grounded. The signal is inputted to the other end of the resistance dividing circuit 20.

In the circuit shown in FIG. 4, one end and a plurality of fetching electrodes of a resistance dividing circuit 20 are respectively parallel-connected to an output terminal of an OP amplifier 21 via discrete switches 22. The other end of the resistance dividing circuit 20 is connected to the corresponding low-voltage input terminal of the OP amplifier 21. A high-voltage input terminal of the OP amplifier 21 is grounded. Further, an input resistor 23 is connected to the low-voltage input terminal. A signal is inputted to the low-voltage input terminal via the input resistor 23.

In either applied example, the plurality of switches 22 to be turned ON are selected to control the gain of the signal to be outputted. The gain of the outputted signal is determined by R1/R2 corresponding to a ratio of a resistance value (R1) between the input terminal and the low-voltage input terminal to a resistance value (R2) between the output terminal and the low-voltage input terminal.

Figure 5:
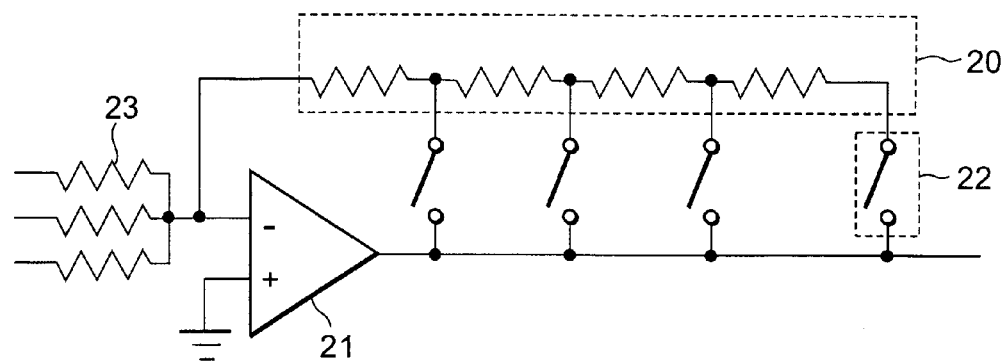
FIG. 5 is a view illustrating a circuit to which the resistance dividing circuit of the present invention is applied.
Figure 6:
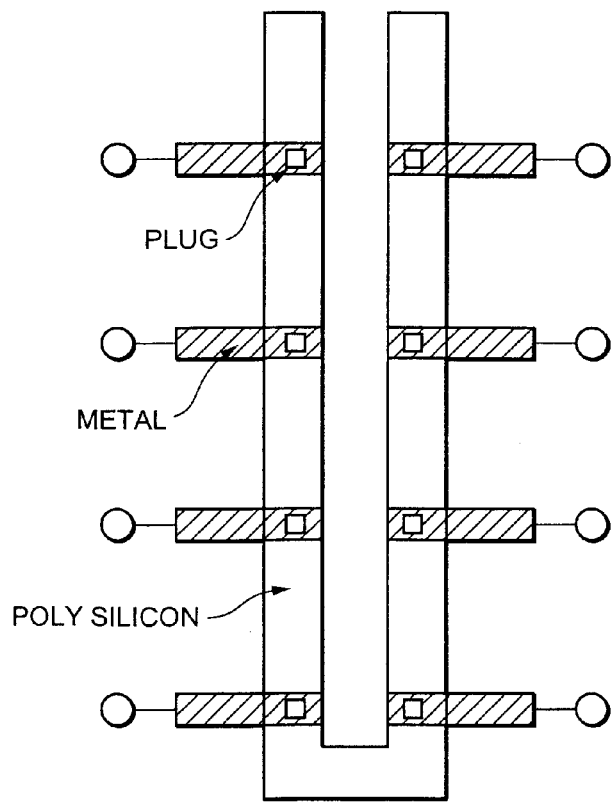
FIG. 6 is a plan view showing one example of a conventional resistance dividing circuit.

If input resistors 23 different in resistance value from one another are parallel-connected to a low-voltage input terminal in plural form as shown in FIG. 5 where the resistance dividing circuit 20 of the present invention is applied to the circuit shown in FIG. 4 in particular, it is then possible to control R1 as well as R2 by selecting the input resistors 23 used for signal input.

FIGS. 2A, 2C, 2E, 2G, 2I, 2K, 2M and 2O are respectively plan views showing a method for manufacturing a resistance dividing circuit of the present invention. FIGS. 2B, 2D, 2F, 2H, 2J, 2L, 2N and 2P are respectively cross-sectional views showing cut cross-sections taken along lines X-Y of FIGS. 2A, 2C, 2E, 2G, 2I, 2K, 2M and 2O. The method of manufacturing the resistance dividing circuit of the present invention will be explained using FIGS. 2A through 2P.

Figure 2A:
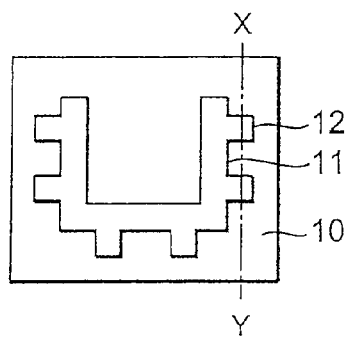
FIGS. 2A, 2C, 2E, 2G, 2I, 2K, 2M and 2O are plan views.
Figure 2B:
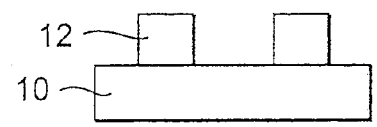
FIGS. 2B, 2D, 2F, 2H, 2J, 2L, 2N and 2P are respective cross-sectional views illustrating a method of manufacturing a resistance dividing circuit of the present invention.

As shown in FIG. 2A and FIG. 2B, a linear polysilicon layer 11, which serves as a resistance wiring, is formed on a semiconductor substrate 10. At this time, the polysilicon layer 11 is formed so as to have branch portions 12 at arbitrary portions of the polysilicon layer 11.

Figure 2C:
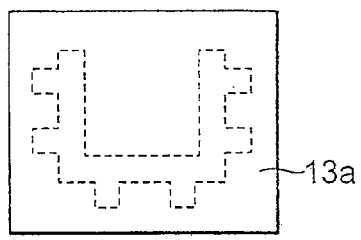
Figure 2D:
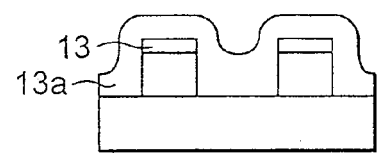

Subsequently, as shown in FIGS. 2C and 2D, a metal layer 13a is deposited over the entire semiconductor substrate 10 including the polysilicon layer 11. Thereafter, the metal layer 13a is caused to react with the polysilicon layer 11 by heat treatment to selectively form silicide layers 13 on the polysilicon layer 11 (salicide process).

Figure 2E:
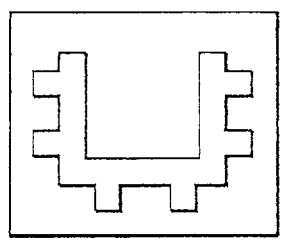
Figure 2F:
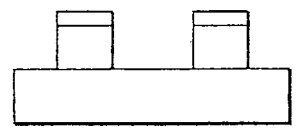

After the salicide process, the metal layer 13a, which did not react with the polysilicon layer 11, is removed as shown in FIGS. 2E and 2F.

Figure 2G:
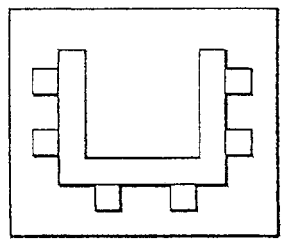
Figure 2H:
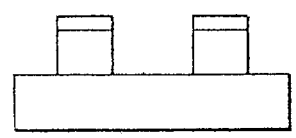

Thereafter, as shown in FIGS. 2G and 2H, the silicide layers 13 are selectively removed by photolithography and etching to cause the silicide layers 13 to remain only on the branch portions 12.

Figure 2I:
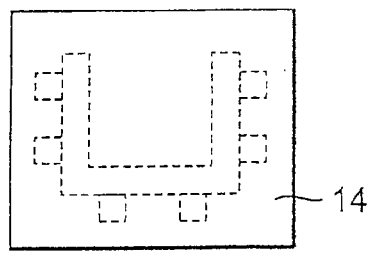
Figure 2J:
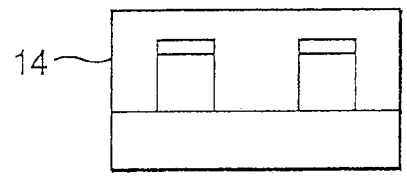

Further, as shown in FIGS. 2I and 2J, $SiO_2$ is formed over the entire semiconductor substrate 10 containing the polysilicon layer 11 and the silicide layers 13 as an insulating layer 14.

Figure 2K:
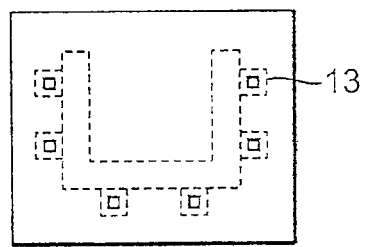
Figure 2L:
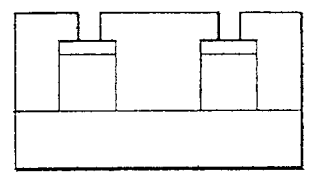

Next, as shown in FIGS. 2K and 2L, portions of the insulating layer 14, which correspond to the silicide layers 13, are opened by photolithography and etching to expose the silicide layers 13.

Figure 2M:
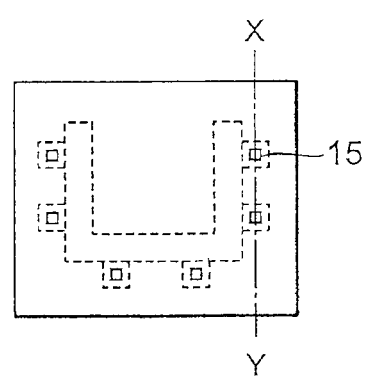
Figure 2N:
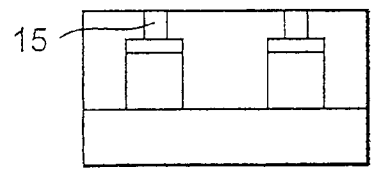

Then, as shown in FIGS. 2M and 2N, contact plugs 15 made up of doped polysilicon or a metal are charged into their corresponding openings.

Figure 2O:
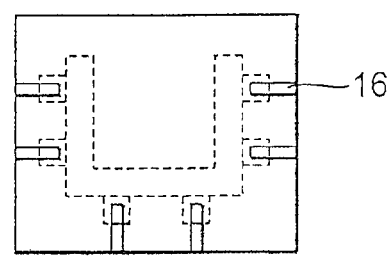
Figure 2P:
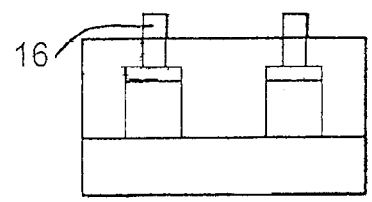

Finally, as shown in FIGS. 2O and 2P, metal wirings 16 respectively connected to the contact plugs 15 are formed on the insulating layer 14, thereby leading to completion of the resistance dividing circuit of the present invention.

While the preferred forms of the present invention have been described, it is to be understood that modifications will be apparent to those skilled in the art without departing from the spirit of the invention. The scope of the invention is to be determined solely by the following claims.

What is claimed is:

1. A resistance dividing circuit comprising:
   a linear resistance wiring made up of polysilicon, said resistance wiring on a semiconductor substrate and having a plurality of branch portions on the semiconductor substrate;
   silicide layers formed only on the branch portions of said resistance wiring;
   an insulating layer formed so as to cover the semiconductor substrate, the resistance wiring and the silicide layers;
   contact plugs extending through the insulating layer and having lower ends connected to the silicide layers; and
   fetching terminals connected to upper ends of the contact plugs respectively.

2. A programmable gain amplifier comprising:
   a resistance dividing circuit, which has a linear resistance wiring made up of polysilicon, said resistance wiring on a semiconductor substrate and having a plurality of branch portions on the semiconductor substrate, and silicide layers formed on the branch portions, and an insulating layer formed so as to cover the semiconductor substrate, the resistance wiring and the silicide layers, and contact plugs extending through the insulating layer and having lower ends connected to the silicide layers, and fetching terminals connected to upper ends of the contact plugs respectively;
   an operational amplifier equipped with a high-voltage input terminal, a low-voltage input terminal and an output terminal,
   wherein a plurality of the fetching terminals of the resistance dividing circuit are respectively parallel-connected to the low-voltage input terminal via discrete switches, and
   wherein the high-voltage input terminal is grounded.

3. The programmable gain amplifier according to claim 2, wherein one end of the resistance dividing circuit is connected to the output terminal.

4. A programmable gain amplifier comprising:
   a resistance dividing circuit, which has a linear resistance wiring made up of polysilicon, said resistance wiring on a semiconductor substrate and having a plurality of branch portions on the semiconductor substrate, and silicide layers formed on the branch portions, and an insulating layer formed so as to cover the semiconductor substrate, the resistance wiring and the silicide layers, and contact plugs extending through the insulating layer and having lower ends connected to the silicide layers, and fetching terminals connected to upper ends of the contact plugs respectively; and
   an operational amplifier equipped with a high-voltage input terminal, a low-voltage input terminal and an output terminal,
   wherein a plurality of the fetching terminals of the resistance dividing circuit are respectively parallel-connected to the output terminal via discrete switches, and
   wherein the high-voltage input terminal is grounded.

5. The programmable gain amplifier according to claim 4, wherein one end of the resistance dividing circuit is connected to the low-voltage input terminal.

6. The programmable gain amplifier according to claim 4, wherein an input resistor is further connected to the low-voltage input terminal.

7. The programmable gain amplifier according to claim 4, wherein a plurality of the input resistors respectively different in resistance value are connected in parallel to the low-voltage input terminal.

8. A method for manufacturing a resistance dividing circuit, comprising:
   forming a linear resistance wiring having a plurality of branch portions and made up of polysilicon on a semiconductor substrate;
   forming silicide layers only on the branch portions of the resistance wiring;
   forming an insulating layer over the semiconductor substrate containing the resistance wiring and the silicide layers;
   forming contact plugs extending through the insulating layer and having lower surfaces connected to the silicide layers; and
   forming fetching terminals respectively connected to upper surfaces of the contact plugs.

9. The method according to claim 8, wherein the silicide layers are formed by:
   forming a metal layer on the semiconductor substrate containing the resistance wiring,
   causing the metal layer and the resistance wiring to react with each other to thereby selectively form silicide layers on the resistance wiring,
   removing portions of the metal layer that remain after the reaction, and
   selectively removing the silicide layers in such a manner that the silicide layers remain only on the branch portions of the resistance wiring.

10. A resistance dividing circuit comprising:
    a polysilicon wiring including contact areas adjacent thereto, on a semiconductor substrate;
    silicide layers formed only on the contact areas;
    an insulating layer covering the semiconductor substrate, the polysilicon wiring and the silicide layers;
    contact plugs extending through the insulating layer to the silicide layers; and
    terminals respectively connected to the contact plugs.

11. The resistance dividing circuit of claim 10, further comprising:
    an operational amplifier having an high-voltage input terminal, a low-voltage input terminal and an output terminal,
    wherein the terminals are respectively connected to the low-voltage input terminal via switches, and wherein the high-voltage input terminal is grounded.

12. The resistance diving circuit according to claim 11, wherein one end of the resistance dividing circuit is connected to the output terminal.

13. The resistance dividing circuit according to claim 10, further comprising:
    an operational amplifier having a high-voltage input terminal, a low-voltage input terminal and an output terminal,
    wherein the terminals are respectively connected to the output terminal via switches, and wherein the high-voltage input terminal is grounded.

14. The resistance dividing circuit according to claim 13, wherein one end of the resistance dividing circuit is connected to the low-voltage input terminal.

* * * * *